United States Patent [19]
Rapp

[11] Patent Number: 5,144,226
[45] Date of Patent: Sep. 1, 1992

[54] MULTI-MODE MEASURING SYSTEM
[75] Inventor: Peter J. Rapp, Elmont, N.Y.
[73] Assignee: Core Industries, Bloomfield Hills, Mich.
[21] Appl. No.: 702,245
[22] Filed: May 17, 1991
[51] Int. Cl.$^5$ .................... G06F 15/56; G01R 15/08
[52] U.S. Cl. .................... 324/132; 324/115; 324/133; 324/142; 364/483
[58] Field of Search .............. 324/115, 119, 132, 133, 324/127, 76 R, 117 R, 123 R, 142, 141; 340/653, 660; 307/266, 261, 351; 328/144; 364/481, 483

[56] References Cited
U.S. PATENT DOCUMENTS

| | | | |
|---|---|---|---|
| 3,210,663 | 10/1965 | Moseley et al. | 324/132 |
| 3,257,616 | 6/1966 | Andrushkiw et al. | 324/132 |
| 4,581,705 | 4/1986 | Gilker et al. | 324/76 R |
| 4,612,617 | 9/1986 | Laplace, Jr. et al. | 364/483 |
| 4,721,906 | 1/1988 | Ferguson et al. | 324/132 |
| 4,937,520 | 6/1990 | Arseneau et al. | 324/76 R |

OTHER PUBLICATIONS
"AC Line Monitor" by Thomas R. Fox, *Modern Electronics*, Jul., 1990, pp. 14–21, 70 and 73–75.

Primary Examiner—Vinh Nguyen
Attorney, Agent, or Firm—Weingarten, Schurgin, Gagnebin & Hayes

[57] ABSTRACT

A multi-mode signal measurement system provides at least True RMS and Average RMS signal measurement modes in one system in response to a measurement mode selection made by an operator. The system controls the processing of the input signal by a selected signal measurement unit according to the operator selected signal measurement mode. After signal processing is complete, a display unit displays a value of the measurement of the input signal according to the selected measurement mode. Other measurement modes providing peak value and resistance measurement readings may also be provided.

22 Claims, 4 Drawing Sheets

MULTI-MODE MEASURING SYSTEM

FIELD OF THE INVENTION

This invention relates to electronic meters and more particularly, to a measuring device which provides a number of measurement modes for current and voltage measurements by which waveform distortion can be detected.

BACKGROUND OF THE INVENTION

Until relatively recently, loads connected to an AC main were almost always linear responding. That is, when a sinusoidal voltage is applied to a linear load, the resultant current waveform will also be sinusoidal. Additionally, the current in the linear load is directly proportional to the instantaneous voltage applied to the load.

Recently, many modern electrical and electronic devices present non-linear loads to a power line. When such non-linear loads are connected to an AC power line, current and sometimes voltage waveform distortion results. An RMS scaled averaging meter will give incorrect readings, often understating the potential for overheating and other problems.

Distorted waveforms are more complex than pure sine waves, and are composed of the fundamental sine wave and harmonics of the sine wave frequency. The distorted waveform reflects the arithmetic sum of the instantaneous RMS values of all the harmonic components and the fundamental sine wave frequency. Harmonics which are present on only one phase of a multiphase system will generally appear on the neutral conductor, requiring that conductor to handle, in many cases, more current that it was originally designed to handle. Additionally, triplen harmonics (3rd, 6th, 9th, etc.) that appear on a given phase of a 3-phase system will be additive in the neutral conductor. Further, this problem is not limited to the neutral conductor, as harmonic currents will also be present in transformers and generators associated with the power supply system.

Waveform distortion, also known as harmonic distortion, may cause serious equipment problems. For example, if a 3-phase motor is powered by a distorted voltage, there will be an uneven torque on the motor, which may cause the motor to overheat and prematurely fail.

Waveform distortion can cause instrumentation reading errors and can go undetected if a proper measuring system is not used. Most portable instrumentation is "average" responding scaled to RMS. For a "pure" non-distorted sine wave, such an "average" responding instrument will indicate the RMS value of the waveform with reasonable accuracy. However, for the distorted current waveforms found on most power lines, the same "average" responding instrument will read lower than the actual RMS value. For example, for an SCR waveform with a conduction or firing angle of 90°, an "average" responding instrument will read 29% lower than the "true" RMS value. Other types of distorted waveforms may produce even more serious errors. Most importantly, the user of the measurement system will not even be aware of any waveform distortion.

To overcome these inaccuracies, a measurement mode called "True RMS" has been developed. A "True RMS" measurement system computes the true effective heating value of any waveform. "Average RMS" and "True RMS" responding systems will both read exactly the same on pure sine waves. On distorted waveforms, however, only the "True RMS" responding system will produce accurate RMS readings.

To date, however, no single instrument is available to measure both "Average RMS" and "True RMS" in response to user selection, to allow a user to detect and estimate waveform distortion. Heretofore, a user had to have separate instruments for True and Average RMS signal measurements. Further, those same measurements, as well as additional computations, are required to compute power line conditions such as "Form Factor".

SUMMARY OF THE INVENTION

This invention features a multi-mode signal measurement system including at least a True RMS measurement unit and an Average scaled to RMS measurement unit. The system is adapted to measure both the voltage and current of a given input signal and thus provides the capability of providing both True and Average RMS voltage and True and Average RMS current measurements.

An operator selects one measurement mode from among several measurement modes. The system controls the processing of the input signal by a selected signal measurement unit according to the operator selected signal measurement mode. After signal processing is complete, a display unit displays a value of the measurement of the input signal according to the selected measurement mode.

Accordingly, the system provides one compact multi-mode signal measuring system wherein the user may quickly and easily obtain both a True RMS and an Average scalted to RMS signal measurement. By comparing the two measurement mode signals, the user can determine whether the input signal has significant waveform distortion. Additionally, the same signal measuring system may also serve to provide peak signal voltage and current measurements which provide a further indication of input signal condition, as well as resistance measurements.

The system of the present invention may be housed in a small hand-held instrument, a bench size instrument, or other appropriately sized housing. The system may also utilize True RMS, Average RMS and Peak measurement modes to compute one or more power line condition indications such as Crest Factor, Form Factor and Transformer derating factor.

DESCRIPTION OF THE DRAWINGS

These, and other features and advantages of the present invention will be better understood by reading the following detailed description, taken together with the drawings, wherein.

DETAILED DESCRIPTION OF THE INVENTION

Figure 1:
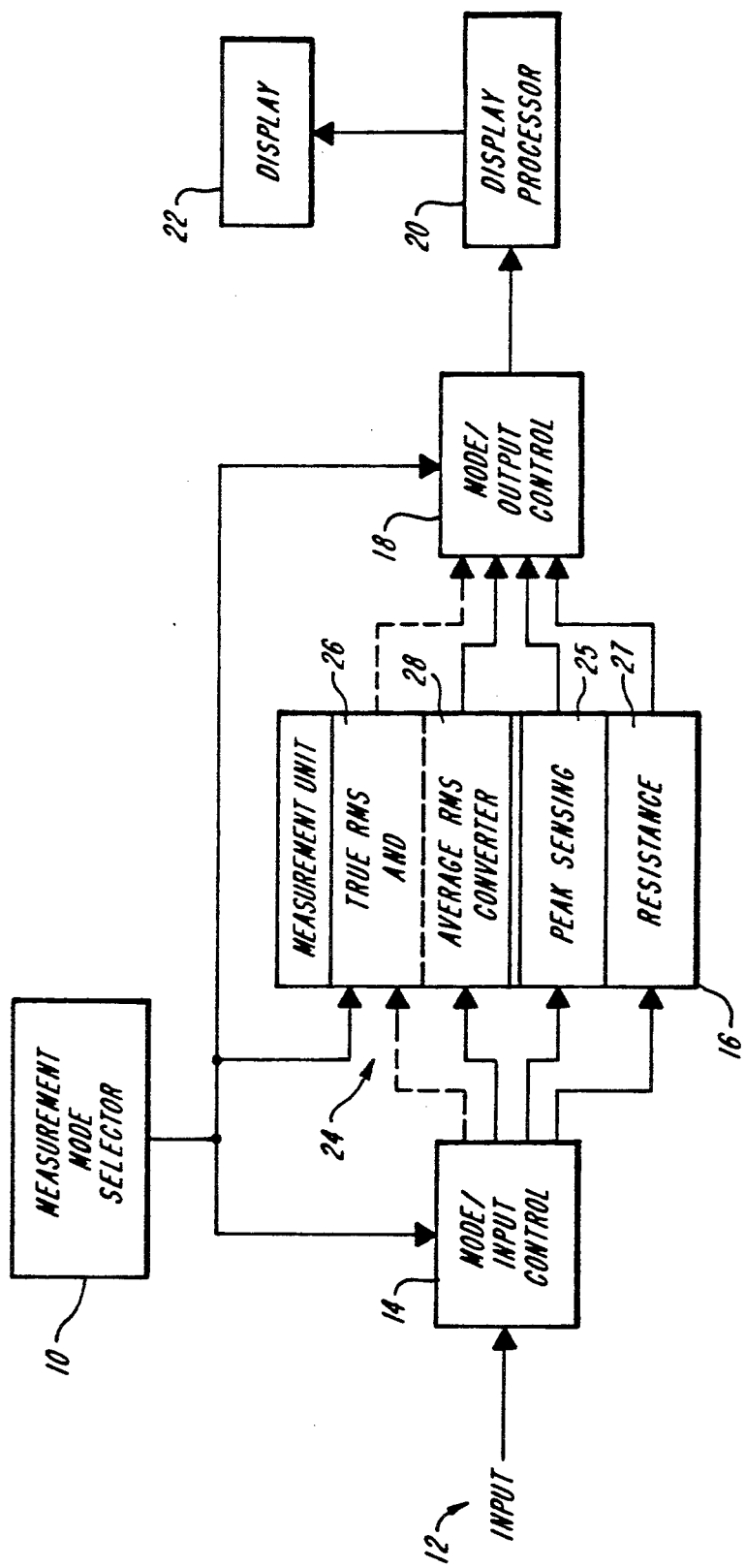
FIG. 1 is a block diagram of the multi-mode measurement system according to the present invention.

The multi-mode signal measuring system of the present invention includes a measurement mode selector 10, FIG. 1, whereby an operator selects the measurement mode by which the system processes and measures the value of an input signal 12.

Mode/input control unit 14 receives input signal 12 along with a signal from measurement mode selector 10, and directs the input signal to the appropriate measurement unit of measurement unit 16 according to the selected measurement mode.

After processing the input signal, mode/output control unit 18 selects the output from the appropriate measurement unit, and directs the output to display processor 20, which formats the data for display unit 22 for display to the operator.

Measurement unit 16 includes at least one signal measurement unit 24. In one embodiment, measurement unit 24 includes a True RMS converter 26 which, with appropriate switching, also serves as an Average RMS converter 28 by functioning as a precision rectifier whose filtered output is the RMS scaled average of the input signal, thus providing an Average RMS output. It is also contemplated that separate True RMS and Average RMS converters may be provided.

In the embodiment wherein measurement unit 24 is selectively operable as both a True RMS converter 26 and an Average RMS converter 28, measurement unit 24 is responsive to measurement mode selector 10 for switching between the two functions.

In the preferred embodiment, measurement unit 16 also includes a Peak measurement unit and converter 25 which allows the measurement of voltage and current surges, such as those current surges encountered during a starting interval of a motor. The system may also include an additional measurement unit such as resistance measurement unit 27.

Figure 2:
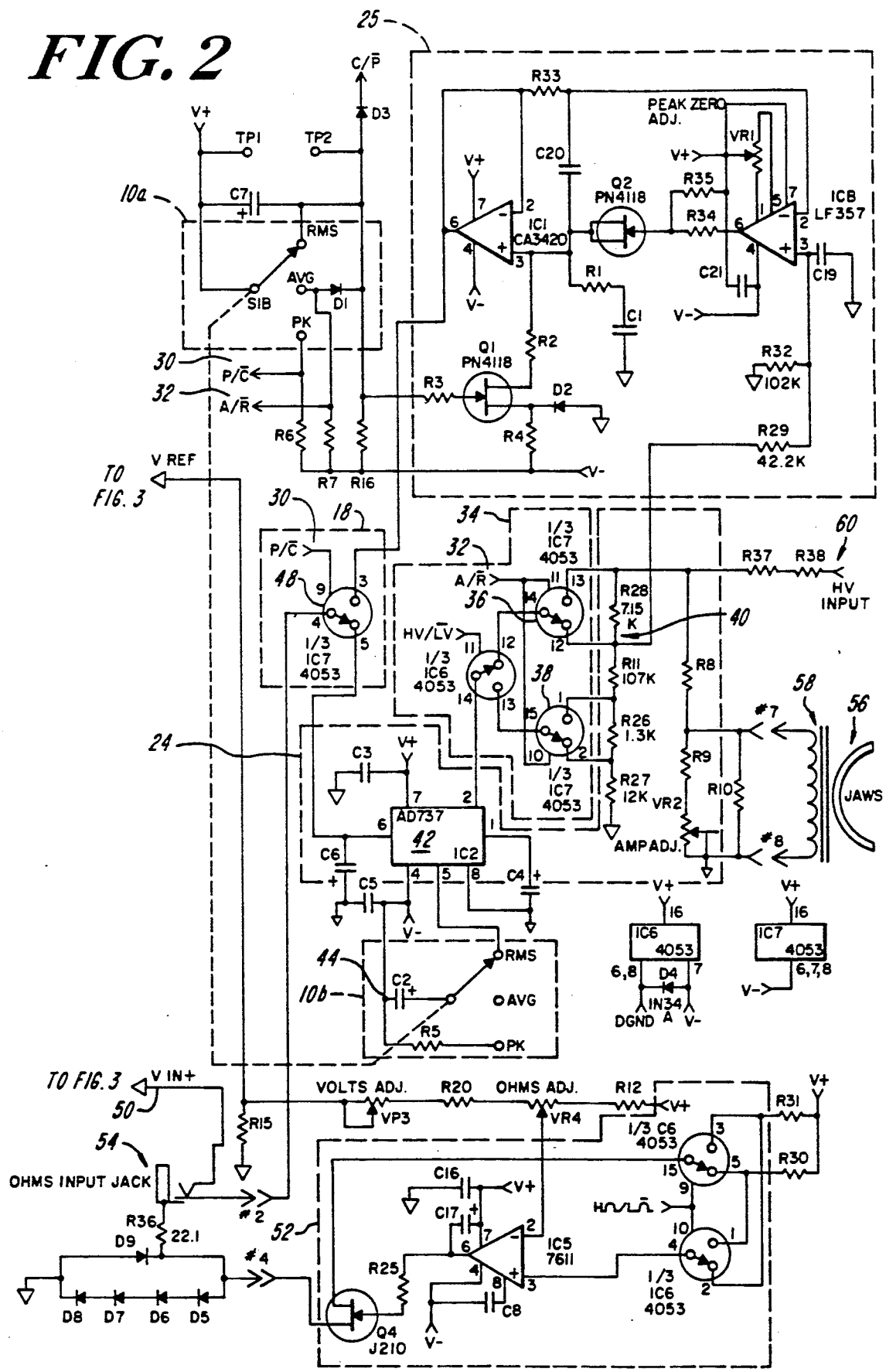
FIGS. 2 and 3 are schematic diagrams illustrating one embodiment of the multi-mode measurement system of the present invention.
Figure 3:
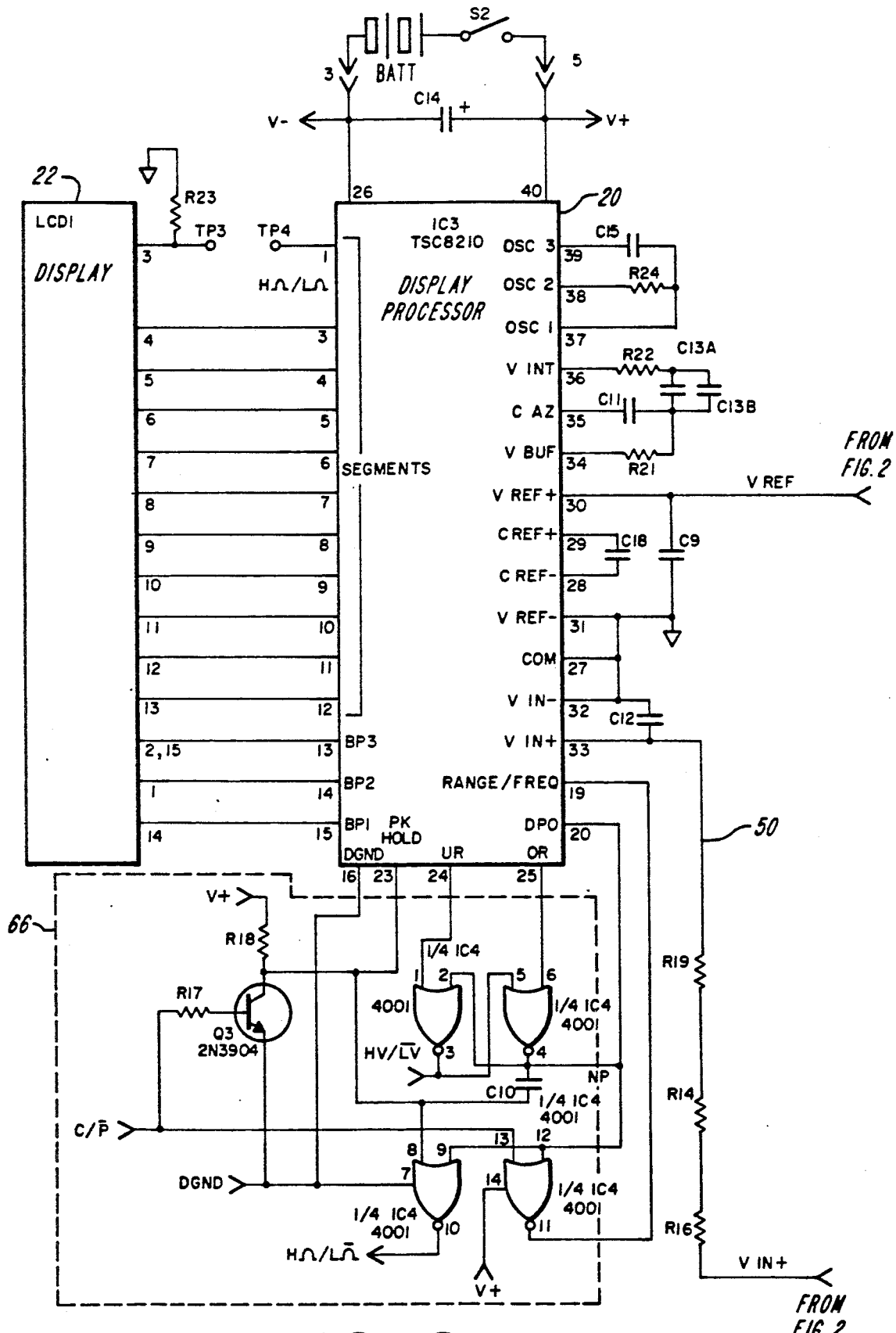

One implementation of the multi-mode signal measuring system according to the present invention is illustrated in the schematic diagrams of FIGS. 2 and 3 wherein in FIG. 2 is shown measurement mode selector switch portions 10a and 10b which allow the operator to select between True RMS, Average RMS, Peak-Hold, and resistance signal measurement modes. In FIGS. 2 and 3, the components used in this embodiment are appropriately labeled.

Output signals 30 and 32 from the measurement mode selector 10a provide measurement mode selection signals to one or more mode control units such as mode input control circuitry 14. In this embodiment, mode control circuitry 34 includes first and second switches 36 and 38, responsive to measurement mode selection signal 32, for scaling the input to the true-RMS-to-DC converter 42. Simultaneously, measurement mode selector 10b controls whether true-RMS-to-DC converter 42 will act as a True-RMS-to-DC converter (for True RMS mode), or as a precision rectifier (for Average RMS mode).

On a pure sine wave, the True RMS value of an input signal is 70.7% of the instantaneous value at the peak of the sine wave. Similarly, the full wave rectified average value of a sine wave is 63.7% of its peak value or 90% of the True RMS value. Thus, the True RMS value is 1.111 times the Average RMS value. Accordingly, average sensing scaled to RMS (Average RMS) results when the average value is multiplied by 1.111.

Accordingly, the True RMS/Average RMS converter functions of measurement unit 24 are selected by mode input control circuitry 14 which scales the input by selecting the input signal from one of two positions on voltage divider network 40 comprised of resistors R28, R11, R26, R27, R29 and R32. In one position, the signal input to measurement unit 24 in the Average RMS value mode will be approximately 1.111 times greater than that input to measurement unit 24 in the True RMS mode thus scaling the average signal to RMS.

In this embodiment, measurement unit 24 includes true-RMS-to-DC converter 42 (AD737) which receives an input signal on pin 2 from the mode input control circuit 14, and provides a converted output signal on pin 6. When computing True RMS, this embodiment of the system of the present invention utilizes capacitor 44 to perform the "mean" in the root-mean-square (RMS) calculation. When measurement mode selector switch 10b is positioned to provide Average RMS measurement, the capacitor is removed and thus, the converter 42 performs a "root square" of the input signal, thereby calculating its absolute value, so that the converter 42 acts like a precision rectifier. Filtering the output from converter 42 with capacitor C6 yields a rectified average signal scaled to RMS (Average RMS).

The system of the present invention also includes mode/output control circuitry 18 which in the present embodiment includes output control switch 48. Output control switch 48 is responsive to measurement mode selection signal 30 to switch between output from the first measurement unit 24 providing True or Average RMS signal conversion, and another measurement unit 25 which in this embodiment is shown as a Peak sensing signal converter. The output 50 from mode/output control circuit 18 will later be processed for display.

Also included in this embodiment of the present invention is a third measurement unit 27 which provides resistance measurements to the display processor 20 when input is received from input jack 54.

This embodiment of the present invention is illustrated as a clamp-on meter wherein to perform signal measurement, a current transducer 56 is clamped around a conductor whose current is to be measured. Current transformer 58 transforms the current induced in the transformer into a voltage level suitable for processing by the system. In addition to or in place of the clamp-on jaws, a direct input such as high voltage input 60 and resistance measurement jack 54 may be provided.

After the input signal 12 is processed by the appropriate converter selected by the given signal measurement mode selected by the user, the processed measurement signal 50, FIG. 3, serves as input to display processor 20 which in this embodiment is an A/D converter, which provides appropriate display drive signals to an LCD display unit 22. Control circuitry 66 provide additional features of the system of the present invention including ranging and control of peak signal detection and holding, itself known in the art. For example, control circuit 66 may control range of voltage, current or resistance measurement, and may control the switching between continuous operation or Peak sampling and hold operation used when the Peak-Hold measurement mode is selected.

Although one embodiment of the present invention accomplishes both ranging and RMS scaling (for the Average mode) using voltage divider network 40 as the input, the present invention also contemplates using an operational amplifier with switchable gain to accomplish the input signal scaling.

It is also contemplated the present invention may be implemented by a microprocessor under control of appropriate software. Additional processing functions including the computation of crest factor and form factor may be performed by the microprocessor under control of appropriate software.

Figure 4:
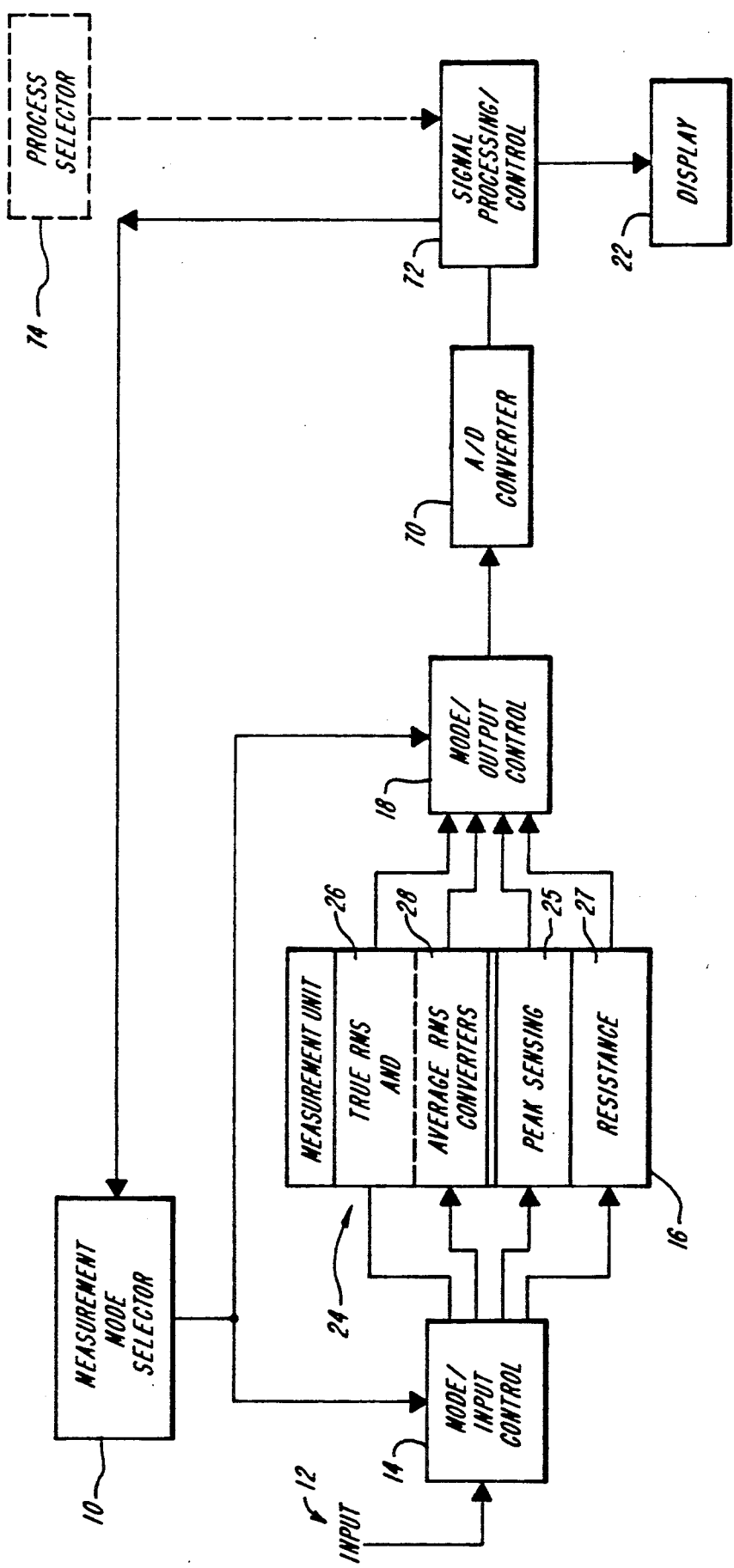
FIG. 4 is a block diagram of another embodiment of the multi-mode measurement system of the present invention.

Another embodiment of the multi-mode measurement system according to the present invention is shown in FIG. 4 and includes an A/D converter 70 which receives an analog output signal from mode/output control unit 18. A/D converter 70 provides a digital signal to signal processing/control circuitry 72 which includes a microprocessor running under control of appropriate software. In this embodiment, signal processing/control unit 72 utilizes the measured signal value to provide further additional computations prior to providing a signal to display unit 22.

For example, signal processing/control unit 72 may automatically compute one or more power line condition factors such as Crest Factor and Form Factor. When computing Crest Factor or Form Factor, signal processing/control unit 72 selectively controls measurement mode selector 10 to first perform a signal measurement on the input signal in either the True RMS, Average RMS or Peak measurement mode. After obtaining a measure of the input signal in the first selected mode, signal processing/control unit 72 selectively directs measurement mode selector 10 to sequentially switch to the remaining required measurement mode wherein a second measure of the input signal is performed in a different measurement mode. Subsequently, signal processing/control unit 72 performs the appropriate computation on the two output signals corresponding to the input signal measured in two measurement modes, and provides the appropriate signal to display unit 22.

Signal processing/control unit 72 may be adapted to automatically provide one selected power line condition factor. Alternatively, this embodiment also contemplates the use of process selector 74 whereby an operator or another system may selectively select one power line condition such as Crest or Form Factor to be calculated by signal processing/control unit 72 from among a number of possible line condition calculations.

Modifications and substitutions by one of ordinary skill in the art are considered to be within the scope of the present invention which is not to be limited except by the claims which follow.

I claim:

1. A multi-mode signal measuring system comprising:
   means for receiving an input signal to be measured;
   mode selector means, for providing at least one measurement mode selection signal, for selecting at least one signal measurement mode from among a plurality of available signal measurement modes, said plurality of available signal measurement modes including at least a True RMS measurement mode and an Average RMS measurement mode;
   signal measurement means including at least a True RMS signal measurement unit and an Average RMS signal measurement unit, each of said signal measurement units operative for processing an input signal according to said measurement mode selection signal, and for providing a measurement unit output signal corresponding to said input signal processed according to said measurement mode selection signal;
   mode control means, coupled to said signal measurement means, and responsive to said at least one measurement mode selection signal, for controlling the processing of said input signal by a selected signal measurement unit according to said measurement mode selection signal, and for controlling the providing of said measurement unit output signal of said selected signal measurement unit to a display means; and
   signal measurement display means, responsive to said measurement unit output signal, for displaying a value of the measurement of the input signal according to measurement mode selection signal.

2. The system of claim 1 wherein said means for receiving an input signal includes inductance means.

3. The system of claim 2 wherein said inductance means includes a transformer.

4. The system of claim 1 wherein said means for receiving an input signal includes an input jack.

5. The system of claim 1 wherein said input signal is a pure sine wave.

6. The system of claim 1 wherein said input signal is a distorted waveform.

7. The system of claim 1 wherein said signal measurement means further includes a Peak sensing measurement unit.

8. The system of claim 1 wherein said signal measurement means includes a resistance measurement unit.

9. The system of claim 1 wherein said mode control means includes at least one measurement unit input switch, and at least one measurement unit output switch.

10. The system of claim 1 wherein said signal measurement means includes at least one signal measurement unit selectably operable as one of a True RMS signal measurement converter and an Average RMS signal measurement converter; and
    wherein said mode control means includes means for selecting the operation of said at least one signal measurement unit as one of said True RMS signal measurement converter and an Average RMS signal measurement converter.

11. The system of claim 1 wherein said signal measurement display means includes a liquid crystal display.

12. The system of claim 1 wherein said signal measuring system provides voltage measurement.

13. The system of claim 1 wherein said signal measuring system provides current measurement.

14. A true RMS and Average RMS signal measuring system comprising:
    means for receiving an input signal to be measured;
    mode selector means, for providing at least one measurement mode selection signal, for selecting one signal measurement mode from among a plurality of available signal measurement modes, said plurality of available signal measurement modes including a True RMS measurement mode and an Average RMS measurement mode;
    at least one signal measurement unit, responsive to a measurement mode control signal, and selectably operable as one of a True RMS signal measurement converter and an Average RMS signal measurement converter, said signal measurement converters selectably operative for processing an input signal according to said measurement mode selection signal, and for providing a measurement output signal corresponding to said input signal processed according to said measurement mode selection signal;
    mode control means, coupled to said at least one signal measurement unit, and responsive to said at least one measurement mode selection signal, for providing a measurement mode control signal for controlling the processing of said input signal by said signal measurement unit according to said measurement mode selection signal, and for providing said measurement output signal to a display means; and signal measurement display means, responsive to said measurement output signal, for displaying a value of the measurement of the input signal according to said measurement mode selection signal.

15. The system of claim 14 further including a Peak sensing measurement unit.

16. The system of claim 14 wherein said means for receiving an input signal includes transformer means.

17. The system of claim 14 wherein said signal measuring system provides voltage and current measurement.

18. A True RMS and Average RMS and Peak sensing signal measuring system comprising:

means for receiving an input signal to be measured;

mode selector means, for providing at least one measurement mode selection signal for selecting one signal measurement mode from among a plurality of available signal measurement modes, said plurality of available signal measurement modes including a True RMS measurement mode, an Average RMS measurement mode and a Peak sensing measurement mode;

signal measurement means including at least a True RMS signal measurement unit, an Average RMS signal measurement unit, and a Peak sensing signal measurement unit, each of said signal measurement units operative for processing an input signal according to said measurement mode selection signal, and for providing a measurement output signal corresponding to said input signal processed according to said measurement mode selection signal mode control means, coupled to said signal measurement means, and responsive to said at least one measurement mode selection signal, for selecting one signal measurement unit, and for controlling the processing of said input signal by said selected signal measurement unit according to said measurement mode selection signal and for providing said measurement output signal to a display means; and signal measurement display means, responsive to said measurement output signal, for displaying a value of the measurement of the input signal according to said measurement mode selection signal.

19. A multi-mode measuring system for a power line condition measuring apparatus comprising:

means for receiving an input signal to be measured;

mode selector means, responsive to a signal measurement control signal, for providing at least one measurement mode selection signal sequentially selecting at least first and second signal measurement modes from among a plurality of available signal measurement modes;

a plurality of signal measurement units, each of said signal measurement units operative for processing said input signal according to said at least one measurement mode selection signal, and for providing a measurement output signal;

mode control means, coupled to said plurality of signal measurement units, and responsive to said at least one measurement mode selection signal, for controlling the sequential processing of said input signal by at least first and second sequentially selected signal measurement units according to said at least one measurement mode selection signal, and for sequentially providing at least first and second measurement output signals of said at least first and second sequentially selected signal measurement units to a signal processing means;

processing means, responsive to said at least first and second measurement output signals, for computing at least one power line signal condition, and for providing a power line signal condition measurement signal and a signal measurement control signal; and signal measurement display means, responsive to said power line signal condition measurement signal, for displaying a value of the measurement of the selected power line signal condition.

20. The system of claim 19 wherein said power line signal condition includes at least one signal condition selected from the group including Crest Factor, Form Factor and transformer derating factor.

21. The system of claim 19 wherein said signal measurement units are selected from the group including a True RMS signal measurement unit, an Average RMS signal measurement unit and a Peak sensing signal measurement converter.

22. The system of claim 19 further including means for selecting one power line signal condition from among a plurality of power line signal conditions, and for providing a power line signal condition measurement selection signal to said processing means.

* * * * *

UNITED STATES PATENT AND TRADEMARK OFFICE
CERTIFICATE OF CORRECTION

PATENT NO. : 5,144,226
DATED     : September 1, 1992
INVENTOR(S) : Peter J. Rapp It is certified that error appears in the above-identified patent and that said Letters Patent is hereby corrected as shown below:

Column 2, line 34, "scalted" should read --scaled--.

Signed and Sealed this

Twenty-second Day of March, 1994

Attest:

BRUCE LEHMAN

Attesting Officer        Commissioner of Patents and Trademarks